(12) United States Patent
Takizawa et al.

(10) Patent No.: US 8,125,816 B2
(45) Date of Patent: Feb. 28, 2012

(54) SEMICONDUCTOR STORAGE DEVICE

(75) Inventors: Ryousuke Takizawa, Kanagawa (JP);
Shinichiro Shiratake, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 12/488,450

(22) Filed: Jun. 19, 2009

(65) Prior Publication Data

US 2009/0316470 A1    Dec. 24, 2009

(30) Foreign Application Priority Data

Jun. 19, 2008  (JP) ................................. 2008-160527

(51) Int. Cl.
*G11C 11/22* (2006.01)

(52) U.S. Cl. ..... 365/145; 365/63; 365/226; 365/189.09; 365/202; 365/204; 365/207

(58) Field of Classification Search ................ 365/145, 365/63, 226, 189.09, 202, 204, 207
See application file for complete search history.

(56) References Cited

U.S. PATENT DOCUMENTS

| | | | | |
|---|---|---|---|---|
| 5,297,077 A * | 3/1994 | Imai et al. | ...................... | 365/145 |
| 5,367,488 A * | 11/1994 | An | ........................... | 365/189.18 |
| 5,600,587 A * | 2/1997 | Koike | ........................... | 365/145 |
| 5,969,979 A * | 10/1999 | Hirano | ........................... | 365/145 |
| 6,233,170 B1 * | 5/2001 | Yamada | ........................ | 365/145 |
| 6,285,576 B1 * | 9/2001 | Kang | ............................. | 365/145 |
| 6,392,918 B2 * | 5/2002 | Braun et al. | ................... | 365/145 |
| 6,600,674 B2 * | 7/2003 | Kasai | ............................. | 365/145 |
| 6,819,582 B2 * | 11/2004 | Kang | ............................. | 365/145 |
| 6,888,767 B1 * | 5/2005 | Han | ............................. | 365/203 |
| 7,126,867 B2 * | 10/2006 | Kang et al. | .................... | 365/203 |
| 7,145,821 B2 * | 12/2006 | Kang et al. | .................... | 365/203 |
| 2002/0093847 A1 | 7/2002 | Tada | | |

FOREIGN PATENT DOCUMENTS

JP       2002-216498       8/2002

* cited by examiner

*Primary Examiner* — Viet Q Nguyen
(74) *Attorney, Agent, or Firm* — Knobbe, Martens, Olson & Bear, LLP

(57) ABSTRACT

According to the present invention, a semiconductor storage device includes: a first memory cell array including: a first bit line; a first plate line; a first memory cell; a first sense amplifier; a first reference power line configured to supply first reference voltage; a first switching module configured to control a connection between the first reference power line and the first bit line; a second memory cell array including: a second bit line; a second plate line; a second memory cell; a second sense amplifier; a second reference power line configured to supply second reference voltage; a second switching module configured to control a connection between the second reference power line and the second bit line; a control module configured to generate the control signal so as to control a time difference between the first memory cell array and the second memory cell array in precharge operation.

9 Claims, 12 Drawing Sheets

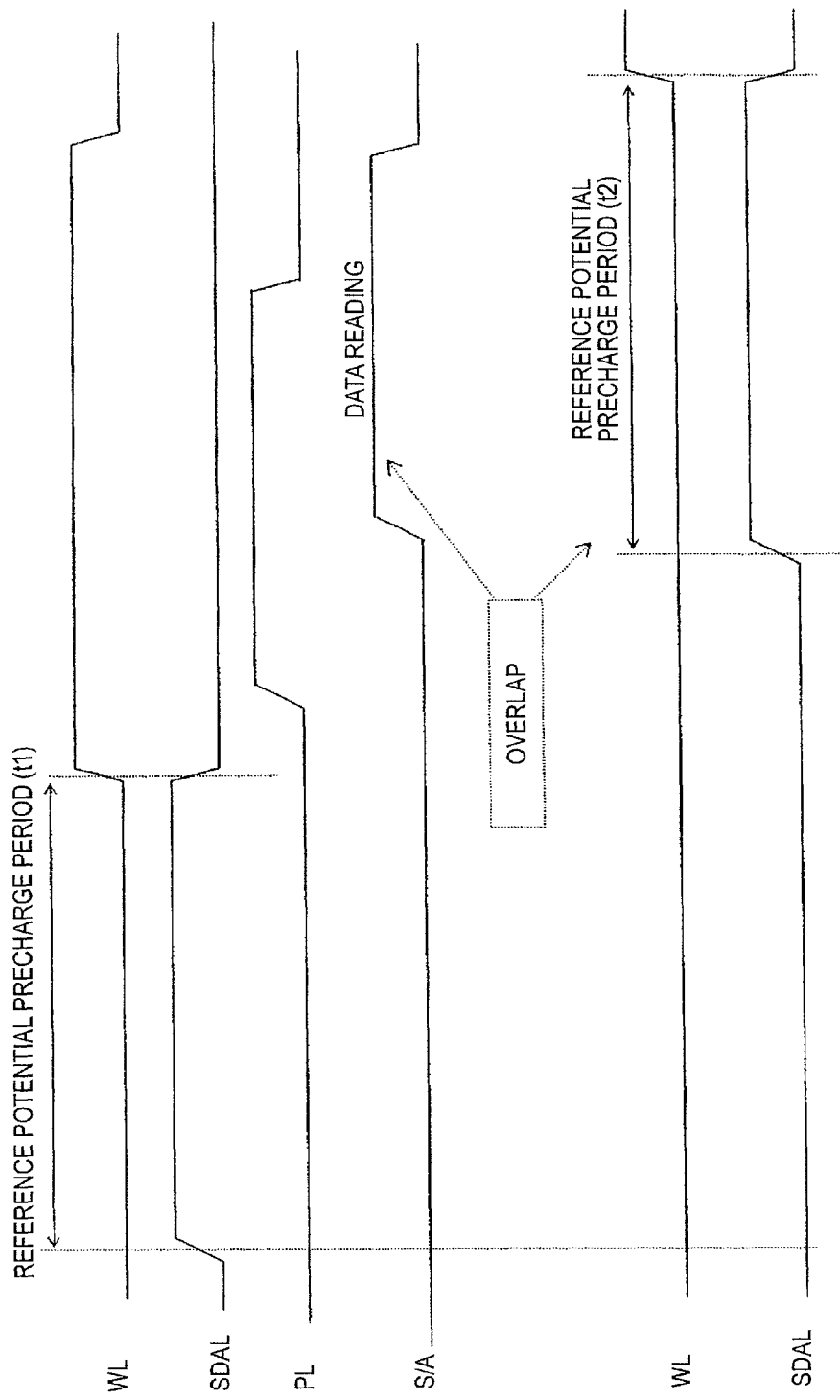

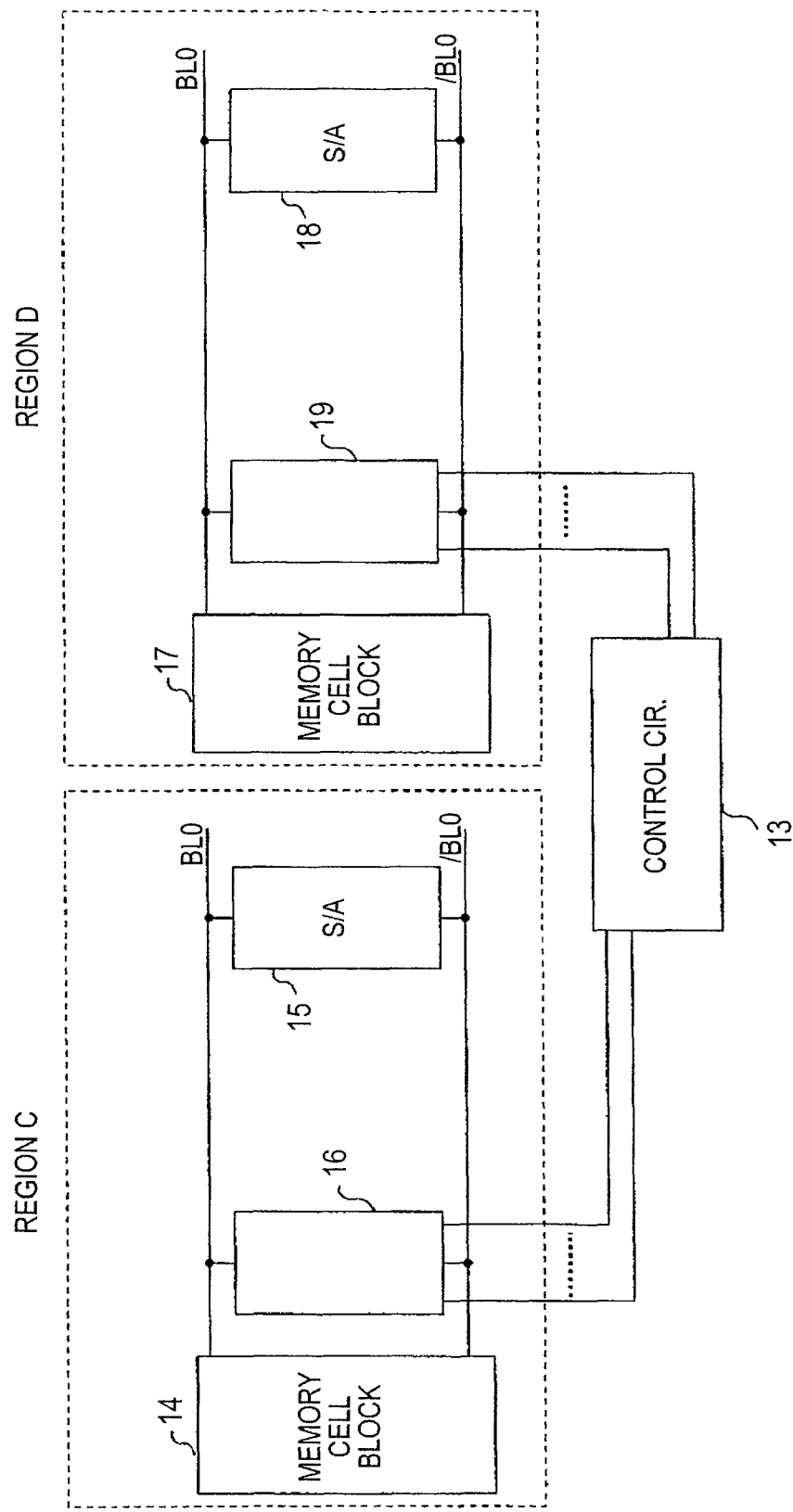

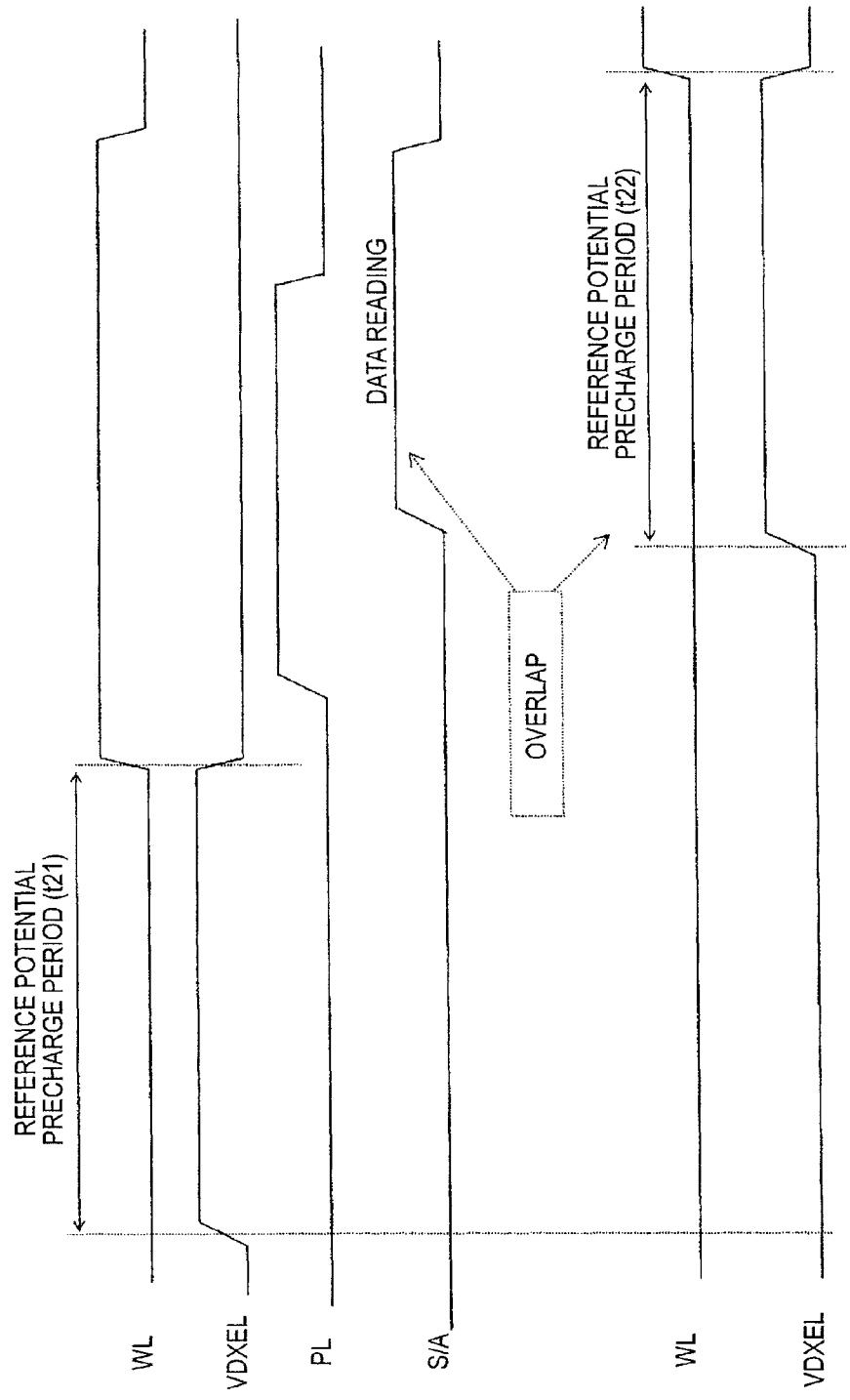

SEMICONDUCTOR STORAGE DEVICE

CROSS-REFERENCE TO RELATED APPLICATIONS

This application is based upon and claims the benefit of priority from Japanese Patent Application No. 2008-160527, filed Jun. 19, 2008, the entire contents of which are incorporated herein by reference.

BACKGROUND

1. Field

The present invention relates to a ferroelectric memory device.

2. Description of the Related Art

Next-generation nonvolatile memories are being developed which have features that rewriting can be performed faster and the maximum allowable number of rewrite operations is five order or more larger than in the conventional EPROM and flash memory and which are comparable to the DRAM in capacity, operation speed, and cost. Such next-generation nonvolatile memories include an FeRAM (ferroelectric random access memory), an MRAM (magnetic random access memory), a PRAM (phase change random access memory) and an ReRAM (resistive random access memory). In the FeRAM which is a ferroelectric memory, memory cell tests such as a 0-write/0-read test and a 1-write/1-read test are performed by changing the reference potential (refer to JP-A-2002-216498, for example).

FeRAM test methods described in JP-A-2002-216498 etc. include a method in which reference potentials are applied directly to bit lines from outside the chip and a method in which reference potentials are applied to bit lines using reference potential generation circuits which incorporate a capacitor. The method in which reference potentials are applied directly from outside the chip has a disadvantage that it takes long time to precharge bit lines. The method using the reference potential generation circuits has a disadvantage that it takes long time to switch the reference potential.

SUMMARY OF THE INVENTION

According to an aspect of the present invention, there is provided a semiconductor storage device including: a first memory cell array including: a first bit line; a first plate line; a first memory cell disposed between the first bit line and the first plate line, the first memory cell including a first ferroelectric capacitor and a first memory cell transistor; a first sense amplifier connected to the first bit line; a first reference power line configured to supply first reference voltage to the first bit line; a first switching module configured to control a connection between the first reference power line and the first bit line based on control signal; a second memory cell array including: a second bit line; a second plate line; a second memory cell disposed between the second bit line and the second bit line, the second memory cell including a second ferroelectric capacitor and a second memory cell transistor; a second sense amplifier connected to the second bit line; a second reference power line configured to supply second reference voltage to the second bit line, the second reference power line being electrically separated from the first reference power line; a second switching module configured to control a connection between the second reference power line and the second bit line based on the control signal; a control module configured to generate the control signal so as to control a time difference between the first memory cell array and the second memory cell array in precharge operation of the first bit line and the second bit line.

According to another aspect of the present invention, there is provided a semiconductor storage device including: a first memory cell array including: a first bit line; a first plate line; a first memory cell disposed between the first bit line and the first plate line, the first memory cell including a first ferroelectric capacitor and a first memory cell transistor; a first sense amplifier connected to the first bit line; a first voltage generation module including a first capacitor to accumulate charge and configured to generate first precharge voltage from the accumulated charge and first reference voltage applied to the first voltage generation module, the first precharge voltage being applied to the first bit line based on control signal; a first reference power line configured to apply the first reference voltage to the first voltage generation module; a second memory cell array including: a second bit line; a second plate line; a second memory cell disposed between the second bit line and the second plate line, the second memory cell including a second ferroelectric capacitor and a second memory cell transistor; a second sense amplifier connected to the second bit line; a second voltage generation module including a second capacitor to accumulate charge and configured to generate second precharge voltage from the accumulated charge and second reference voltage applied to the second voltage generation module, the second precharge voltage being applied to the second bit line based on the control signal; a second reference power line configured to apply the second reference voltage to the second voltage generation module, the second reference power line being electrically separated from the first reference power line; a control module configured to generate the control signal so as to control a time difference between the first memory cell array and the second memory cell array in precharge operation of the first bit line and the second bit line.

According to another aspect of the present invention, there is provided a data read out method for a semiconductor storage device including a first ferroelectric memory cell array including a first bit line and a second ferroelectric memory cell array including a second bit line, the method including: precharging the first bit line to read out first data stored in the first ferroelectric memory cell array; reading out the first data after finishing the precharging of the first bit line; precharging the second bit line to read out second data stored in the second ferroelectric memory cell array while the first data is read out; reading out the second data after finishing the precharging of the second bit line.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary timing chart showing an operation of a screening test on the semiconductor storage device according to the first embodiment.

FIG. 6 is an exemplary circuit diagram showing the internal configuration of the semiconductor storage device according to the second embodiment of the invention.

FIG. 12 is an exemplary timing chart showing an operation of a screening test on the semiconductor storage device according to the third embodiment of the invention.

DETAILED DESCRIPTION

Embodiments of the present invention will be hereinafter described with reference to the drawings. Each of the following embodiments will be directed to a semiconductor storage device (FeRAM) which employs a ferroelectric as each information storage capacitor.

Embodiment 1

Figure 1:
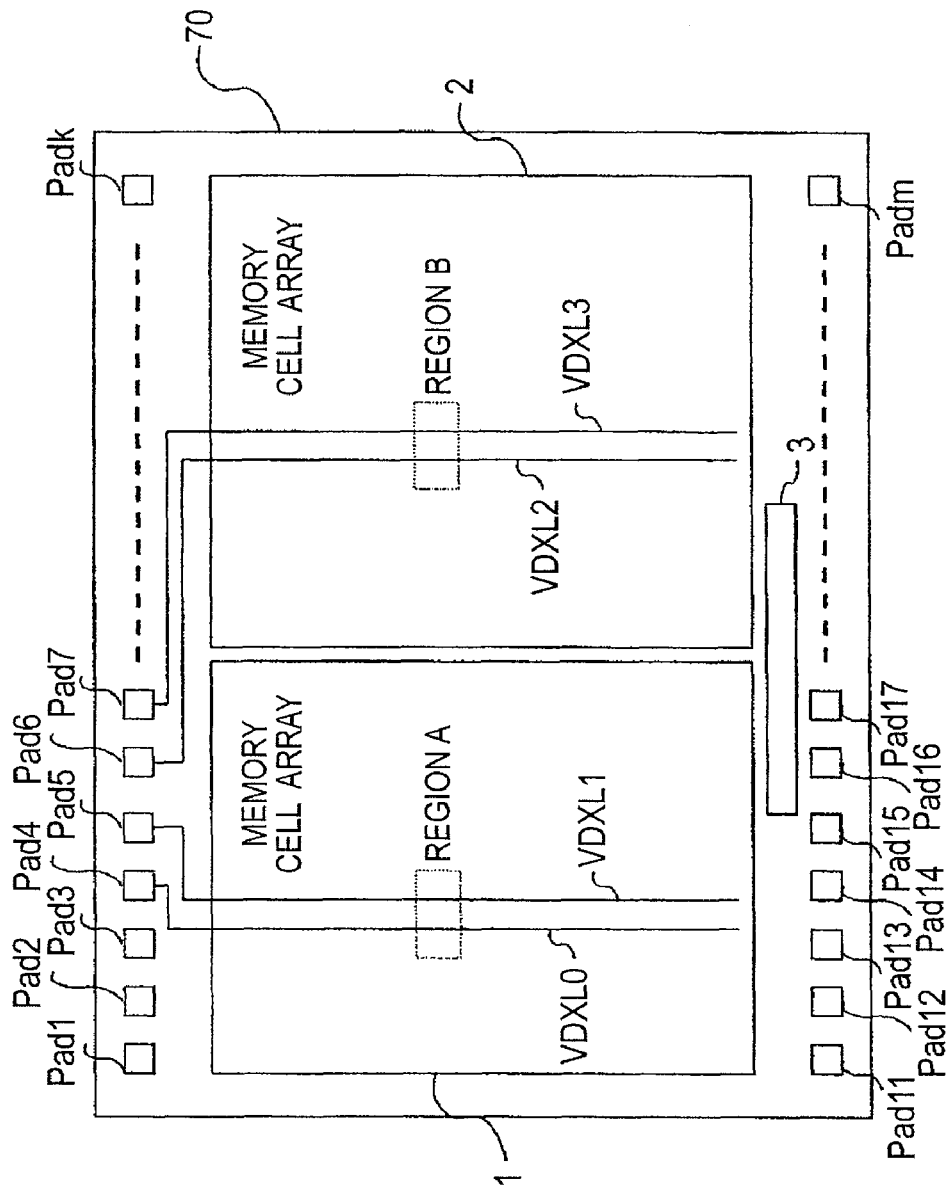
FIG. 1 is an exemplary block diagram of a semiconductor storage device according to a first embodiment.
Figure 2:
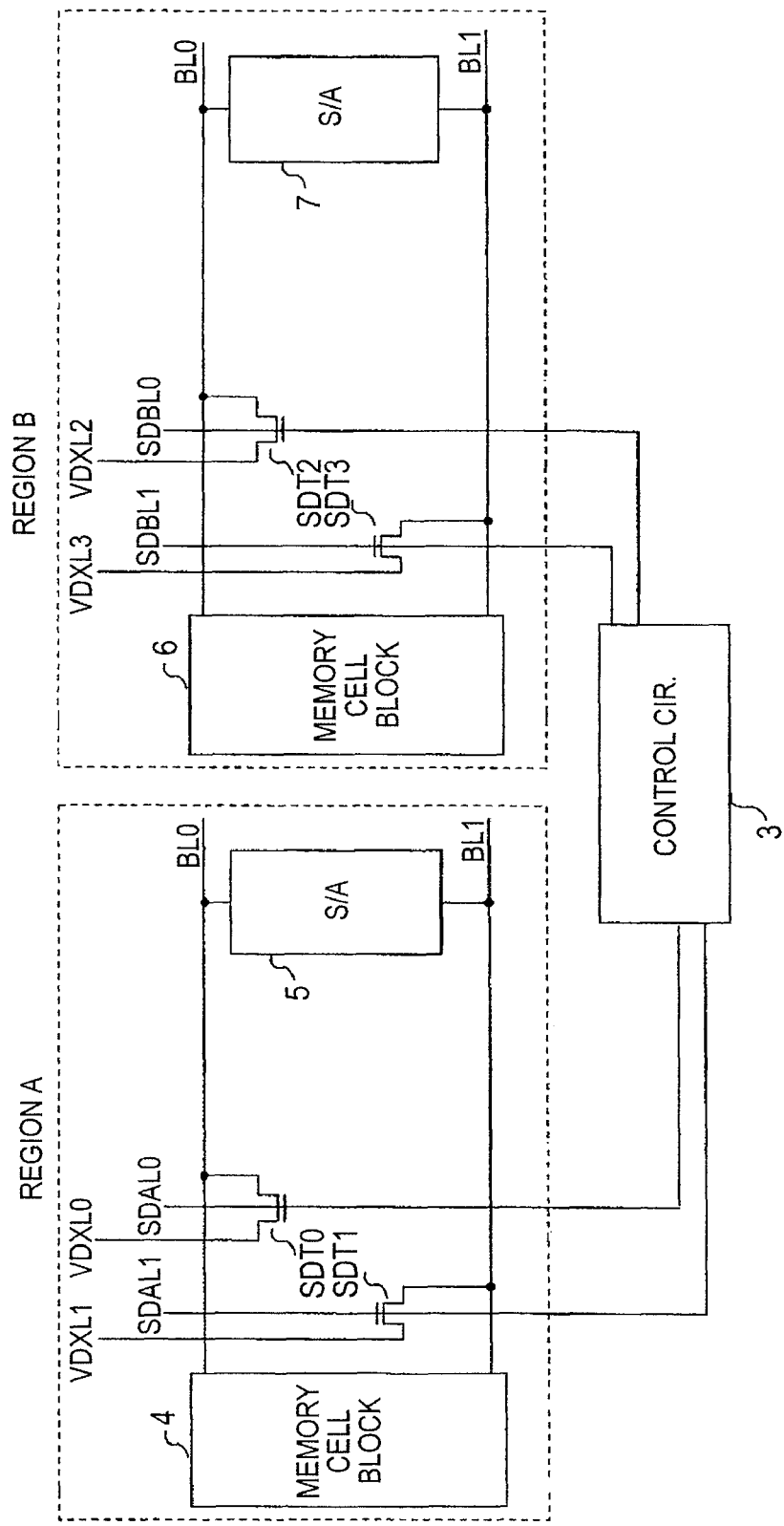
FIG. 2 is an exemplary circuit diagram showing the internal configuration of the semiconductor storage device according to the first embodiment.

First, a semiconductor storage device according to a first embodiment of the invention will be described with reference to the drawings. FIG. 1 is a block diagram of a semiconductor storage device. FIG. 2 is a circuit diagram showing the internal configuration of the semiconductor storage device. FIG. 3 is a circuit diagram of memory cells. In this embodiment, reference potential precharging of the other cell array is performed during a read cycle of one cell array of a 1T1C ferroelectric memory.

As shown in FIG. 1, a semiconductor storage device 70 is provided with a memory cell array 1, a memory cell array 2, a control circuit 3, terminals Pad1 to Pad7, . . . , a terminal Padk, terminals Pad11 to Pad17, . . . , and a terminal Padm. The semiconductor storage device 70 is a 1T1C ferroelectric memory in which each memory cell is composed of one memory cell transistor and one ferroelectric capacitor. In the semiconductor storage device 70, a test (screening test) is performed by a method in which a reference potential is supplied directly to a selected bit line.

The terminals Pad1 to Pad7, . . . and the terminal Padk are disposed in a top end portion of the semiconductor storage device 70 and the terminals Pad11 to Pad17, . . . and the terminal Padm are disposed in a bottom end portion of the semiconductor storage device 70.

The memory cell array 1 is disposed in a left portion of the semiconductor storage device 70. For example, a reference potential power line VDXL0 which is connected to the terminal Pad4 and a reference potential power line VDXL1 which is connected to the terminal Pad5 extend in the memory cell array 1. The memory cell array 2 is disposed in a right portion of the semiconductor storage device 70. For example, a reference potential power line VDXL2 which is connected to the terminal Pad6 and a reference potential power line VDXL3 which is connected to the terminal Pad7 extend in the memory cell array 2.

The reference potential power lines VDXL0 and VDXL1 penetrate through a region A of the memory cell array 1 and the reference potential power lines VDXL2 and VDXL3 penetrate through a region B of the memory cell array 2. The reference potential power lines VDXL0 and VDXL1 are electrically separated from the reference potential power lines VDXL2 and VDXL3. The reference potential power lines VDXL0-VDXL3 transmit reference potentials that are supplied from, for example, outside the semiconductor storage device 70. These reference potentials are supplied from, for example, a memory tester in a test (screening test) on the semiconductor storage device 70.

Disposed in the semiconductor storage device 70, the control circuit 3 performs memory control such as memory cell writing, reading, and erasure, control of supply of reference potentials to bit lines, and other control. An alternative configuration is possible in which the control circuit 3 is used for the control of supply of reference potentials to bit lines and the memory control such as memory cell writing, reading, and erasure is left to another control circuit.

As shown in FIG. 2, a memory cell block 4, a sense amplifier 5, a reference potential control transistor SDT0, and a reference potential control transistor SDT1 are disposed in the region A of the memory cell array 1.

The memory cell block 4 has plural memory cells and is connected to bit lines BL0 and BL1. The internal configuration of the memory cell block 4 will be described later.

One of the source and the drain of the reference potential control transistor SDT0 is connected to the bit line BL0, the other of the source and the drain is connected to the reference potential power line VDXL0, and its gate is connected to a reference potential control line SDAL0 which is connected to the control circuit 3. The reference potential control transistor SDT0 is supplied with a reference potential that is transmitted by the reference potential power line VDXL0. When a control signal transmitted by the reference potential control line SDAL0 is at the high level, the reference potential control transistor SDT0 is on and supplies the reference potential to a memory cell that is connected to the bit line BL0.

One of the source and the drain of the reference potential control transistor SDT1 is connected to the bit line BL1, the other of the source and the drain is connected to the reference potential power line VDXL1, and its gate is connected to a reference potential control line SDAL1 which is connected to the control circuit 3. The reference potential control transistor SDT1 is supplied with a reference potential that is transmitted by the reference potential power line VDXL1. When a control signal transmitted by the reference potential control line SDAL1 is at the high level, the reference potential control transistor SDT1 is on and supplies the reference potential to a memory cell that is connected to the bit line BL1.

The sense amplifier 5 is connected to the bit lines BL0 and BL1 and provided between a high-potential power supply voltage VCC and a low-potential power supply voltage VSS (neither shown). When the bit line BL0 or BL1 is selected, the sense amplifier 5 reads out information of the memory cell that is connected to the selected bit line.

As shown in FIG. 2, a memory cell block 6, a sense amplifier 7, a reference potential control transistor SDT2, and a reference potential control transistor SDT3 are disposed in the region B of the memory cell array 2.

The memory cell block 6 has plural memory cells and is connected to the bit lines BL0 and BL1. The internal configuration of the memory cell block 6 will be described later.

One of the source and the drain of the reference potential control transistor SDT2 is connected to the bit line BL0, the other of the source and the drain is connected to the reference potential power line VDXL2, and its gate is connected to a reference potential control line SDBL0 which is connected to the control circuit 3. The reference potential control transistor SDT2 is supplied with a reference potential that is transmitted by the reference potential power line VDXL2. When a control signal transmitted by the reference potential control line SDBL0 is at the high level, the reference potential control transistor SDT2 is on and supplies the reference potential to a memory cell that is connected to the bit line BL0.

One of the source and the drain of the reference potential control transistor SDT3 is connected to the bit line BL1, the other of the source and the drain is connected to the reference potential power line VDXL3, and its gate is connected to a reference potential control line SDBL1 which is connected to the control circuit 3. The reference potential control transistor SDT3 is supplied with a reference potential that is transmitted by the reference potential power line VDXL3. When a control signal transmitted by the reference potential control line SDBL1 is at the high level, the reference potential control transistor SDT3 is on and supplies the reference potential to a memory cell that is connected to the bit line BL1.

The sense amplifier 7 is connected to the bit lines BL0 and BL1 and provided between the high-potential power supply voltage VCC and the low-potential power supply voltage VSS (neither shown). When the bit line BL0 or BL1 is selected, the sense amplifier 7 reads out information of the memory cell that is connected to the selected bit line.

Although in this embodiment the reference potential control transistors SDT0-SDT3 are Nch MOSFETs (metal-oxide-semiconductor field-effect transistors), they may be Nch MISFETs (metal-insulator-semiconductor field-effect transistors). The MOSFET is also called a MOS transistor.

The control circuit 3 may be controlled by external signal inputted from an external apparatus through a given pad (not shown). That is, SDAL0, SDAL1, SDBL0, and SDBL1 may be controlled by the external signal.

Figure 3B:
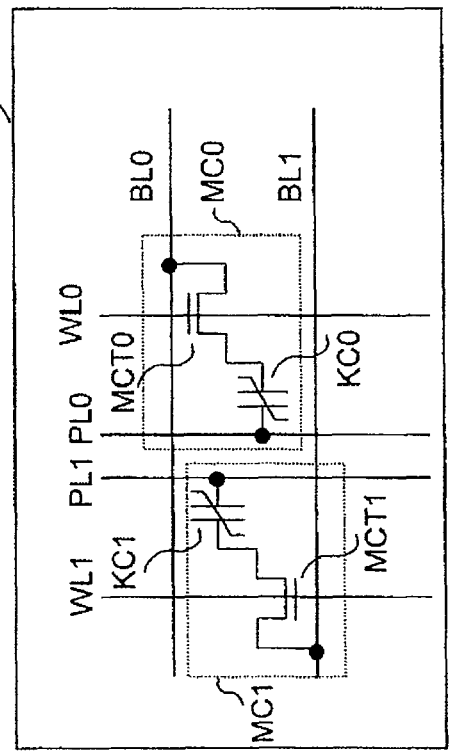
FIGS. 3A and 3B are exemplary circuit diagrams of memory cells according to the first embodiment.
Figure 3A:
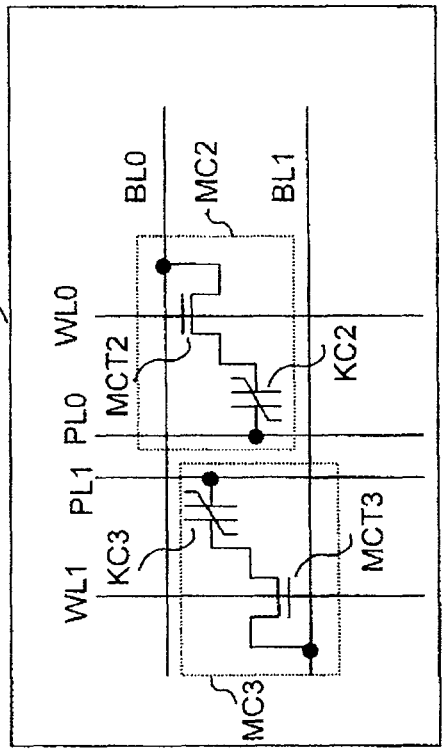

As shown in FIG. 3A, the memory cell block 4 is provided with memory cells MC0 and MC1.

The memory cell MC0 is provided, between the bit line BL0 and a plate line PL0, with a memory cell transistor MCT0 and a ferroelectric capacitor KC0 which are connected to each other in cascade. The gate of the memory cell transistor MCT0 is connected to a word line WL0.

The memory cell MC1 is provided, between the bit line BL1 and a plate line PL1, with a memory cell transistor MCT1 and a ferroelectric capacitor KC1 which are connected to each other in cascade. The gate of the memory cell transistor MCT1 is connected to a word line WL1.

As shown in FIG. 3B, the memory cell block 6 is provided with memory cells MC2 and MC3.

The memory cell MC2 is provided, between the bit line BL0 and the plate line PL0, with a memory cell transistor MCT2 and a ferroelectric capacitor KC2 which are connected to each other in cascade. The gate of the memory cell transistor MCT2 is connected to the word line WL0.

The memory cell MC3 is provided, between the bit line BL1 and the plate line PL1, with a memory cell transistor MCT3 and a ferroelectric capacitor KC3 which are connected to each other in cascade. The gate of the memory cell transistor MCT3 is connected to the word line WL1.

In the embodiment, a ferroelectric film of each of the ferroelectric capacitors KC0-KC3 is made of PZT (lead zirconate titanate, $PbZrTiO_3$) which is a perovskite-type oxide. Alternatively, it may be made of another perovskite-type oxide such as SBT (strontium bismuth tantalate, $SrBi_2Ta_2O_9$) or BLT (lanthanum-added bismuth titanate, $(Bi, La)_4Ti_3O_{12}$), an organic polymer, or the like.

Next, a test (screening test) on the semiconductor storage device will be described with reference to FIG. 4. FIG. 4 is a timing chart showing an operation of a screening test on the semiconductor storage device.

As shown in FIG. 4, in the screening test on the semiconductor storage device 70, first, reference potentials are supplied to the memory cell arrays 1 and 2 via reference potential power lines VDXL. For example, as a first access, a reference potential precharge period (t1) for a first memory cell in the memory cell array 1 is set.

More specifically, a selected word line WL is given the low level and the level of a selected reference potential control line SDAL is changed from the low level to the high level, whereby a selected reference potential control transistor SDT is turned on and a selected bit line BL is precharged to the reference potential.

Then, the level of the reference potential control line SDAL is changed from the high level to the low level, the level of the word line WL is changed from the low level to the high level, and the level of a plate line PL is changed from the low level to the high level, whereby it becomes possible to read out information of the first memory cell of the memory array 1.

Then, as a second access, a reference potential precharge period (t2) for a second memory cell in the memory cell array 2 is set. More specifically, a selected word line WL is given the low level and the level of a selected reference potential control line SDAL is changed from the low level to the high level, whereby a selected reference potential control transistor SDT is turned on and a selected bit line BL is precharged to the reference potential. In parallel with this operation, the level of the sense amplifier 5 is changed from the low level to the high level, whereby charge corresponding to a write state ("0" or "1") of the selected first memory cell in the memory cell array 1 is transferred to the sense amplifier 5 via the selected bit line BL and information of this memory cell is read out.

That is, the reference potential precharge period (t2) for the second memory cell and the reading period for the information of the first memory cell overlap with each other.

As described above, the semiconductor storage device 70 according to the embodiment is equipped with the memory cell arrays 1 and 2, the control circuit 3, the terminals Pad1 to Pad7, . . . , the terminal Padk, the terminals Pad11 to Pad17, . . . , and the terminal Padm. The control circuit 3 on/off-controls a reference potential control transistor SDT for transmitting a reference potential to a selected bit line BL. Reference potential precharging of a selected memory cell of the memory cell array 1 is performed through turning-on of a reference potential control transistor SDT whose gate is connected to a reference potential control line SDAL which is connected to the control circuit 3. Reference potential precharging of a selected memory cell of the memory cell array 2 is performed parallel with reading of information of the selected memory cell of the memory cell array 1.

Since the reading of information of a memory cell of the memory cell array 1 and the reference potential precharging of a memory cell of the memory cell array 2 are performed with an overlap in time, the precharge period can be shortened. As a result, the test time (screening test time) of the semiconductor storage device 70 to which reference potentials are supplied directly can also be shortened.

Although in the embodiment the ferroelectric memory cell structure is the 1T1C structure, it may be a parallel TC unit series connection type (chain type) structure, a 2T2C structure, 6T4C structure, or a 1T structure. Although the embodiment employs the two memory cell arrays, the invention is not limited to such a case.

Embodiment 2

Figure 5:
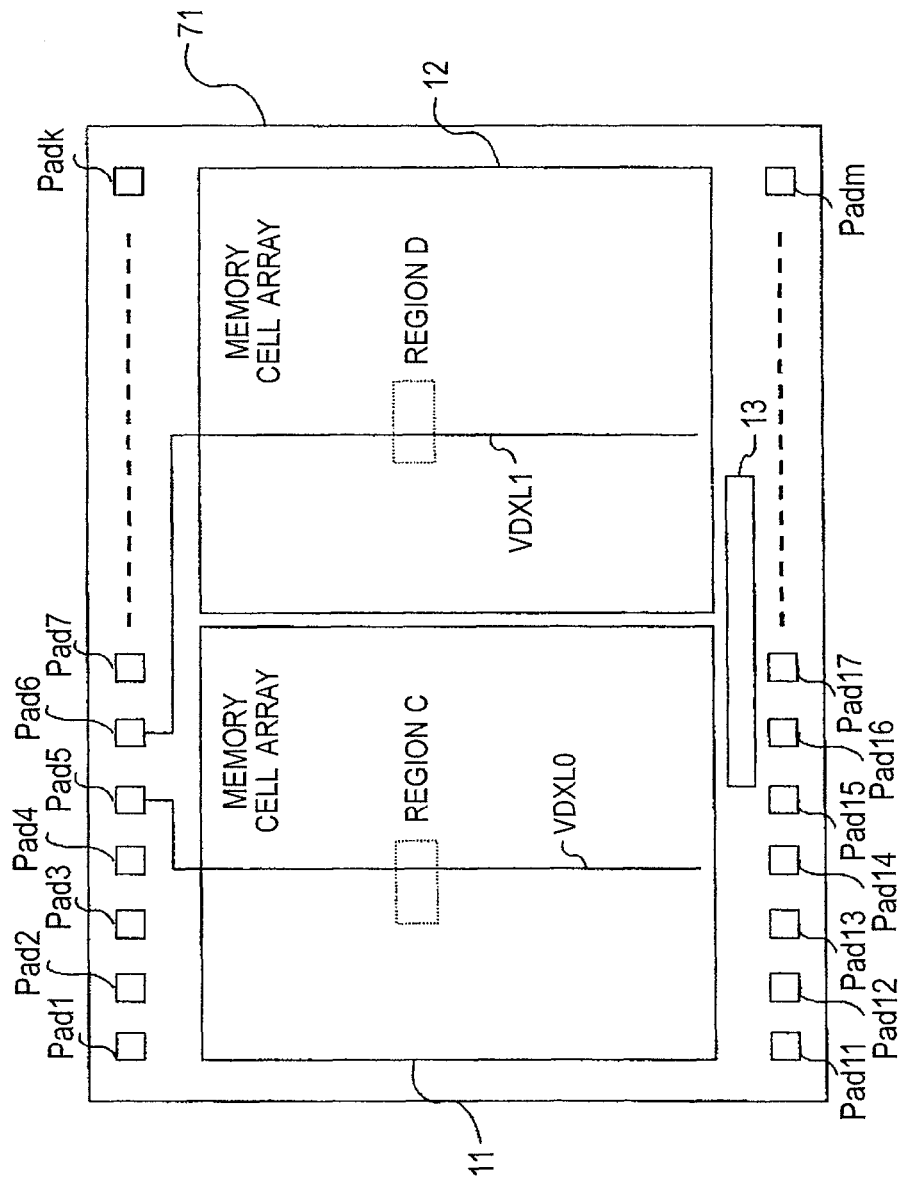
FIG. 5 is an exemplary block diagram of a semiconductor storage device according to a second embodiment.

Next, a semiconductor storage device according to a second embodiment of the invention will be described with reference to the drawings. FIG. 5 is a block diagram of a semiconductor storage device. FIG. 6 is a circuit diagram showing the internal configuration of the semiconductor storage device. FIG. 7 is circuit diagrams of reference potential generation circuits. FIGS. 8A and 8B are circuit diagrams of memory cells. In this embodiment, reference potential precharging of the other cell array is performed during a read cycle of one cell array of a parallel TC unit series connection type (chain type) ferroelectric memory.

As shown in FIG. 5, a semiconductor storage device 71 is provided with a memory cell array 11, a memory cell array 12, a control circuit 13, terminals Pad1 to Pad7, ..., a terminal Padk, terminals Pad11 to Pad17, ..., and a terminal Padm. The semiconductor storage device 71 is a parallel TC unit series connection type (chain type) ferroelectric memory. In the semiconductor storage device 71, a test (screening test) is performed by a MOS capacitor reference potential method in which a reference potential is supplied to a selected bit line using a reference potential generation circuit incorporating a MOS capacitor.

The terminals Pad1 to Pad7, ... and the terminal Padk are disposed in a top end portion of the semiconductor storage device 71 and the terminals Pad11 to Pad17, ... and the terminal Padm are disposed in a bottom end portion of the semiconductor storage device 71.

The memory cell array 11 is disposed in a left portion of the semiconductor storage device 71. A reference potential power line VDXL0 which is connected to the terminal Pad5 extends in the memory cell array 11. The memory cell array 12 is disposed in a right portion of the semiconductor storage device 71. A reference potential power line VDXL1 which is connected to the terminal Pad6 extends in the memory cell array 2. While a test is conducted, reference potentials are supplied to all memory cells of each of the memory cell arrays 11 and 12.

The reference potential power line VDXL0 penetrates through a region C of the memory cell array 11 and the reference potential power lines VDXL1 penetrates through a region D of the memory cell array 12. The reference potential power line VDXL0 is electrically separated from the reference potential power lines VDXL1. The reference potential power lines VDXL0 and VDXL1 transmit reference potentials that are supplied from, for example, outside the semiconductor storage device 71. These reference potentials are supplied from, for example, a memory tester in a test (screening test) on the semiconductor storage device 71.

Disposed in the semiconductor storage device 71, the control circuit 13 performs control of reference potential generation circuits 16 and 19, memory control such as memory cell writing, reading, and erasure, and other control. An alternative configuration is possible in which the control circuit 13 is used for the control of the reference potential generation circuits 16 and 19 and the memory control such as memory cell writing, reading, and erasure is left to another control circuit.

As shown in FIG. 6, a memory cell block 4, a sense amplifier 15, and the reference potential generation circuit 16 are disposed in the region C of the memory cell array 11.

The memory cell block 14 has plural memory cells and is connected to bit lines BL0 and /BL0. The internal configuration of the memory cell block 14 will be described later.

The reference potential generation circuit 16 is connected to the bit lines BL0 and /BL0. The internal configuration of the reference potential generation circuit 16 will be described later.

The sense amplifier 15 is connected to the bit lines BL0 and /BL0 and provided between a high-potential power supply voltage VCC and a low-potential power supply voltage VSS (neither shown). When the bit line BL0 or /BL0 is selected, the sense amplifier 15 reads out information of the memory cell that is connected to the selected bit line.

As shown in FIG. 6, a memory cell block 17, a sense amplifier 18, and the reference potential generation circuit 19 are disposed in the region D of the memory cell array 12.

The memory cell block 17 has plural memory cells and is connected to bit lines BL0 and /BL0. The internal configuration of the memory cell block 17 will be described later.

The reference potential generation circuit 19 is connected to the bit lines BL0 and /BL0. The internal configuration of the reference potential generation circuit 19 will be described later.

The sense amplifier 18 is connected to the bit lines BL0 and /BL0 and provided between the high-potential power supply voltage VCC and the low-potential power supply voltage VSS (neither shown). When the bit line BL0 or /BL0 is selected, the sense amplifier 18 reads out information of the memory cell that is connected to the selected bit line.

Figure 7A:
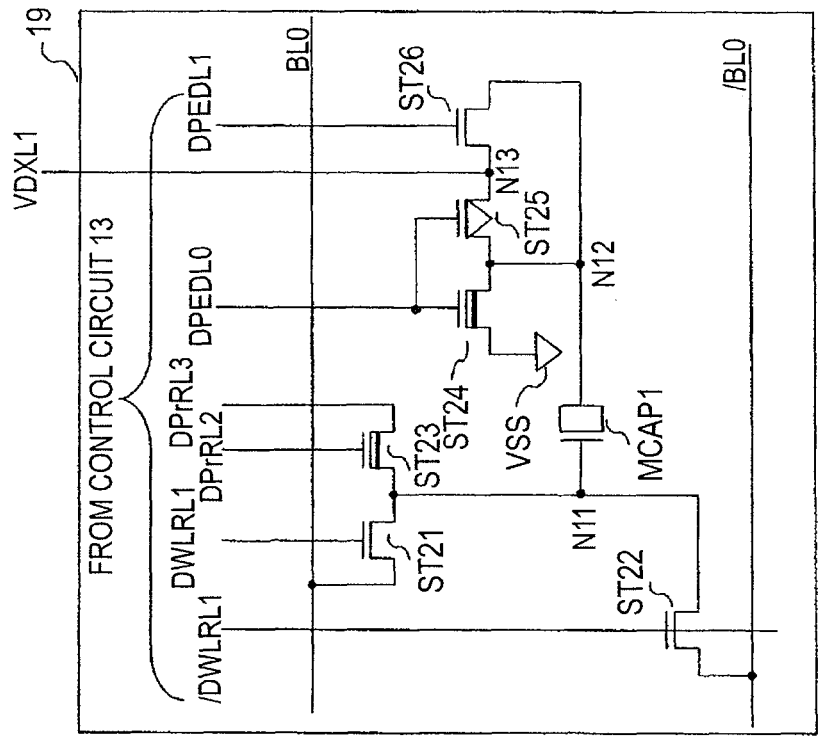
FIGS. 7A and 7B are exemplary circuit diagrams of reference potential generation circuits according to the second embodiment.
Figure 8A:
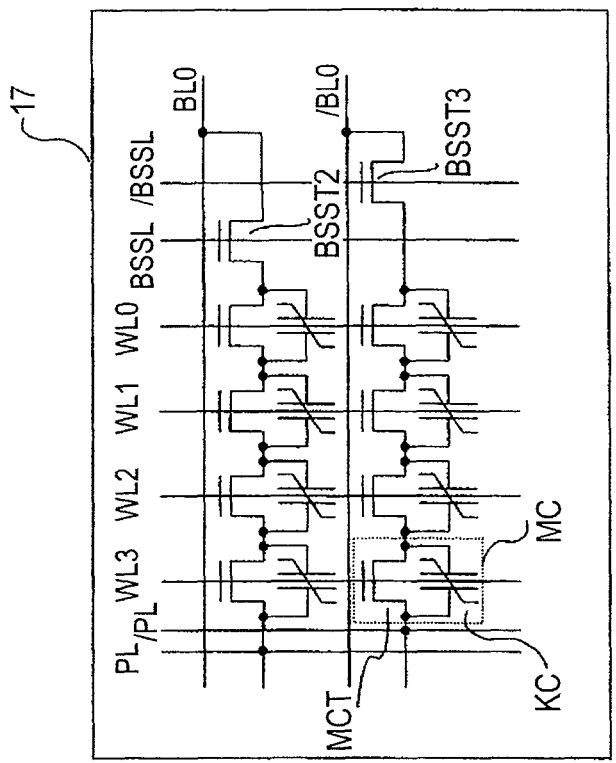
FIGS. 8A and 8B are exemplary circuit diagrams of memory cells according to the second embodiment of the invention.
Figure 8B:
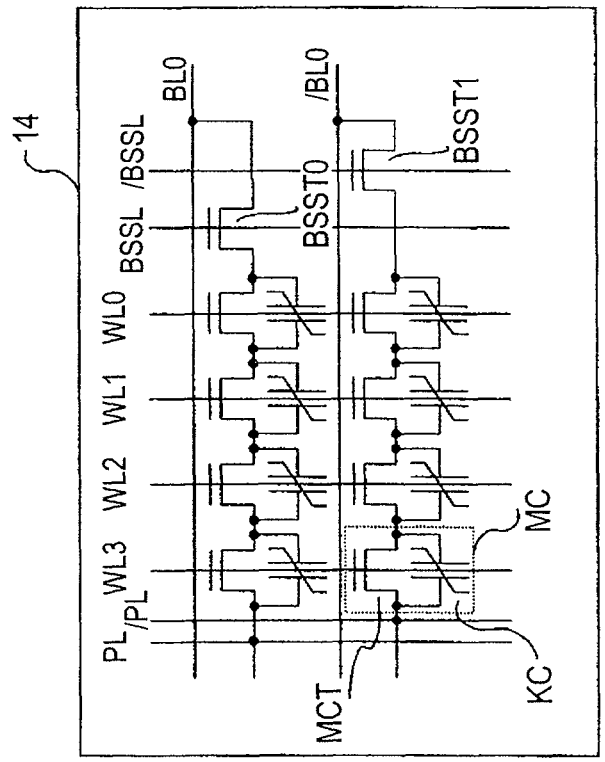

As shown in FIG. 7A, the reference potential generation circuit 16 of the memory cell array 11 is provided with control transistors ST11-ST16 and a MOS capacitor MCAP0. The reference potential generation circuit 16 supplies a reference potential to a selected bit line BL.

The control transistor ST11 is provided between the bit line BL0 and the MOS capacitor MCAP0 (node N1) and its gate is connected to a base dummy word line DWLRL0 which is connected to the control circuit 13. The control transistor ST11 is on when a signal on the base dummy word line DWLRL0 is at the high level, and is off when it is at the low level.

The control transistor ST12 is provided between the bit line /BL0 and the MOS capacitor MCAP0 (node N1) and its gate is connected to a base dummy word line /DWLRL0 which is connected to the control circuit 13. The control transistor ST12 is on when a signal on the base dummy word line /DWLRL0 is at the high level, and is off when it is at the low level.

The control transistor ST13 is provided between a base dummy potential line DPrRL1 and the MOS capacitor MCAP0 (node N1) and its gate is connected to a base dummy potential line DPrRL0. The control transistor ST13 is on when a base dummy potential is supplied to the base dummy potential lines DPrRL0 and DPrRL1.

The control transistor ST14 is provided between a node N2 and a low-potential power supply voltage (ground potential) VSS and its gate is connected to a control line DPECL0. The control transistor ST14 is on when a signal on the control line DPECL0 is at the high level.

The control transistor ST15 is provided between the node N2 and a reference potential power line VDXL0 (node N3) and its gate is connected to the control line DPECL0. The control transistor ST15 is on when a reference potential is supplied to the reference potential power line VDXL0 and a signal on the control line DPECL0 is at the low level.

The control transistor ST16 is provided between the reference potential power line VDXL0 (node N3) and the node N2 and its gate is connected to a control line DPECL1. The control transistor ST16 is on when a reference potential is supplied to the reference potential power line VDXL1 and a signal on the control line DPECL1 is at the high level.

The MOS capacitor MCAP0 is provided between the nodes N1 and N2 and stores charge when a potential difference occurs between the nodes N1 and N2. The MOS capacitor MCAP0 discharges the stored charge to the bit line BL0 when the control transistor is ST11 is turned on, and discharges the stored charge to the bit line /BL0 when the control transistor is ST12 is turned on. That is, the MOS capacitor MCAP0 functions as a precharge capacitor for a selected bit line BL. Furthermore, by turning off the control transistor ST14 and turning on the control transistors ST15 and ST16, the MOS capacitor MCAP0 can increase the potential at the node N1 through coupling when the potential of the reference potential power line VDXL0 is increased.

The base dummy word lines DWLRL0 and /DWLRL0, the base dummy potential lines DPrRL0 and DPrRL1, and the control lines DPECL0 and DPECL1 are connected to the control circuit 13.

Figure 7B:
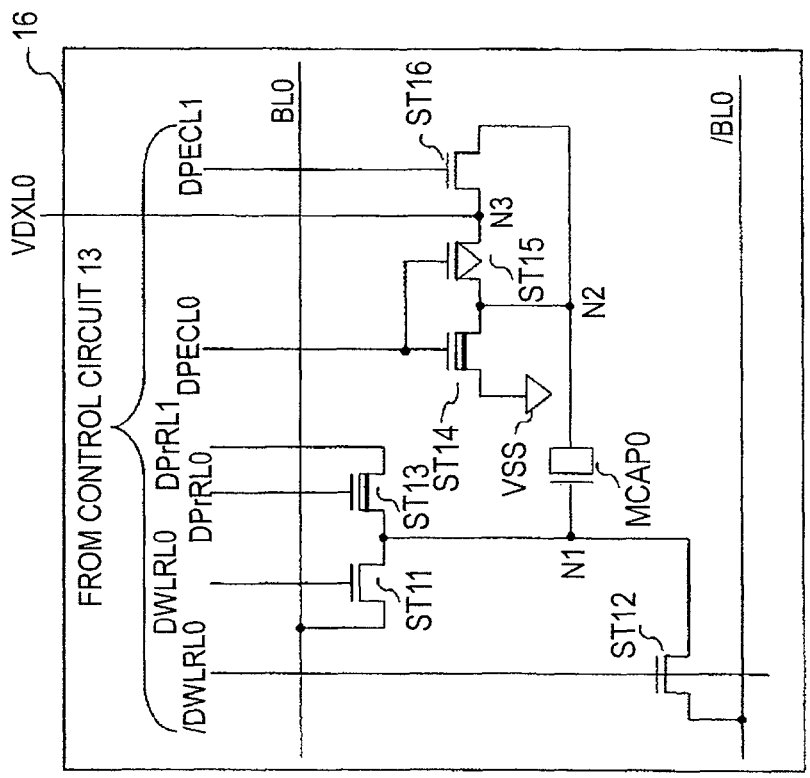

As shown in FIG. 7B, the reference potential generation circuit 19 of the memory cell array 12 is provided with control transistors ST21-ST26 and a MOS capacitor MCAP1. The reference potential generation circuit 19 supplies a reference potential to a selected bit line BL.

The control transistor ST21 is provided between the bit line BL0 and a node N11 and its gate is connected to a base dummy word line DWLRL1. The control transistor ST21 is on when a signal on the base dummy word line DWLRL1 is at the high level.

The control transistor ST22 is provided between the bit line /BL0 and the node N11 and its gate is connected to a base dummy word line /DWLRL1. The control transistor ST22 is on when a signal on the base dummy word line /DWLRL1 is at the high level.

The control transistor ST23 is provided between a base dummy potential line DPrRL3 and the node N11 and its gate is connected to a base dummy potential line DPrRL2. The control transistor ST23 is on when a base dummy potential is supplied to the base dummy potential lines DPrRL2 and DPrRL3.

The control transistor ST24 is provided between a node N12 and the low-potential power supply voltage (ground potential) VSS and its gate is connected to a control line DPEDL0. The control transistor ST24 is on when a signal on the control line DPEDL0 is at the high level.

The control transistor ST25 is provided between the node N12 and a reference potential power line VDXL1 (node N13) and its gate is connected to the control line DPEDL0. The control transistor ST25 is on when a reference potential is supplied to the reference potential power line VDXL1 and a signal on the control line DPEDL0 is at the low level.

The control transistor ST26 is provided between the reference potential power line VDXL1 (node N13) and the node N12 and its gate is connected to a control line DPEDL1. The control transistor ST26 is on when a reference potential is supplied to the reference potential power line VDXL1 and a signal on the control line DPEDL1 is at the high level.

The MOS capacitor MCAP1 is provided between the nodes N11 and N12 and stores charge when a potential difference occurs between the nodes N11 and N12. The MOS capacitor MCAP1 discharges the stored charge to the bit line BL0 when the control transistor is ST21 is turned on, and discharges the stored charge to the bit line /BL0 when the control transistor is ST22 is turned on. That is, the MOS capacitor MCAP1 functions as a precharge capacitor for a selected bit line BL. Furthermore, by turning off the control transistor ST24 and turning on the control transistors ST25 and ST26, the MOS capacitor MCAP1 can increase the potential at the node N11 through coupling when the potential of the reference potential power line VDXL1 is increased.

The base dummy word lines DWLRL1 and /DWLRL1, the base dummy potential lines DPrRL2 and DPrRL3, and the control lines DPEDL0 and DPEDL1 are connected to the control circuit 13.

Although in the embodiment the control transistors ST11-ST14, ST16, ST21-ST24, and ST26 are Nch MOSFETs (MPS transistors), they may be Nch MISFETS. Although the control transistors ST15 and ST25 are Pch MOEFETs (MOS transistors), they may be Pch MISFETs. The threshold voltages of the control transistors ST13, ST14, ST23, and ST24 are set lower than those of the other Nch MOSFETs.

As shown in FIG. 8A, the memory cell block 14 is equipped with parallel TC unit selection transistors BSST0 and BSST1 and eight memory cells MC.

Each memory cell MC is a parallel connection of a memory cell transistor MCT and a ferroelectric capacitor KC.

The parallel TC unit selection transistor BSST0 and a series connection of four memory cells MC are provided between the bit line BL0 and a plate line PL. The parallel TC unit selection transistor BSST1 and a series connection of four memory cells MC are provided between the bit line /BL0 and a plate line/PL.

The gate of the memory cell transistor MCT of the memory cell MC that is closest to the plate line PL and the gate of the memory cell transistor MCT of the memory cell MC that is closest to the plate line /PL are connected to a word line WL3. The gate of the memory cell transistor MCT of the memory cell MC that is second as counted from the plate line PL and the gate of the memory cell transistor MCT of the memory cell MC that is second as counted from the plate line /PL are connected to a word line WL2. The gate of the memory cell transistor MCT of the memory cell MC that is third as counted from the plate line PL and the gate of the memory cell transistor MCT of the memory cell MC that is third as counted from the plate line /PL are connected to a word line WL1. The gate of the memory cell transistor MCT of the memory cell MC that is fourth as counted from the plate line PL and the gate of the memory cell transistor MCT of the memory cell MC that is fourth as counted from the plate line /PL are connected to a word line WL0.

The gate of the parallel TC unit selection transistor BSST0 is connected to a parallel TC unit selection line BSSL. The parallel TC unit selection transistor BSST0 connects the four series-connected memory cells MC to the bit line BL0 when a signal on the parallel TC unit selection line BSSTL is at the high level.

The gate of the parallel TC unit selection transistor BSST1 is connected to a parallel TC unit selection line /BSSL. The parallel TC unit selection transistor BSST1 connects the four series-connected memory cells MC to the bit line /BL0 when a signal on the parallel TC unit selection line /BSSTL is at the high level.

As shown in FIG. 8B, the memory cell block 17 is equipped with parallel TC unit selection transistors BSST2 and BSST3 and eight memory cells MC.

Each memory cell MC is a parallel connection of a memory cell transistor MCT and a ferroelectric capacitor KC.

The parallel TC unit selection transistor BSST2 and a series connection of four memory cells MC are provided between the bit line BL0 and the plate line PL. The parallel TC unit selection transistor BSST3 and a series connection of four memory cells MC are provided between the bit line /BL0 and the plate line /PL.

The gate of the memory cell transistor MCT of the memory cell MC that is closest to the plate line PL and the gate of the memory cell transistor MCT of the memory cell MC that is closest to the plate line /PL are connected to the word line WL3. The gate of the memory cell transistor MCT of the memory cell MC that is second as counted from the plate line PL and the gate of the memory cell transistor MCT of the memory cell MC that is second as counted from the plate line /PL are connected to the word line WL2. The gate of the memory cell transistor MCT of the memory cell MC that is third as counted from the plate line PL and the gate of the memory cell transistor MCT of the memory cell MC that is third as counted from the plate line /PL are connected to the word line WL1. The gate of the memory cell transistor MCT of the memory cell MC that is fourth as counted from the plate line PL and the gate of the memory cell transistor MCT of the memory cell MC that is fourth as counted from the plate line /PL are connected to the word line WL0.

The gate of the parallel TC unit selection transistor BSST2 is connected to the parallel TC unit selection line BSSL. The parallel TC unit selection transistor BSST2 connects the four series-connected memory cells MC to the bit line BL0 when a signal on the parallel TC unit selection line BSSTL is at the high level.

The gate of the parallel TC unit selection transistor BSST3 is connected to the parallel TC unit selection line /BSSL. The parallel TC unit selection transistor BSST3 connects the four series-connected memory cells MC to the bit line /BL0 when a signal on the parallel TC unit selection line /BSSTL is at the high level.

Figure 9:
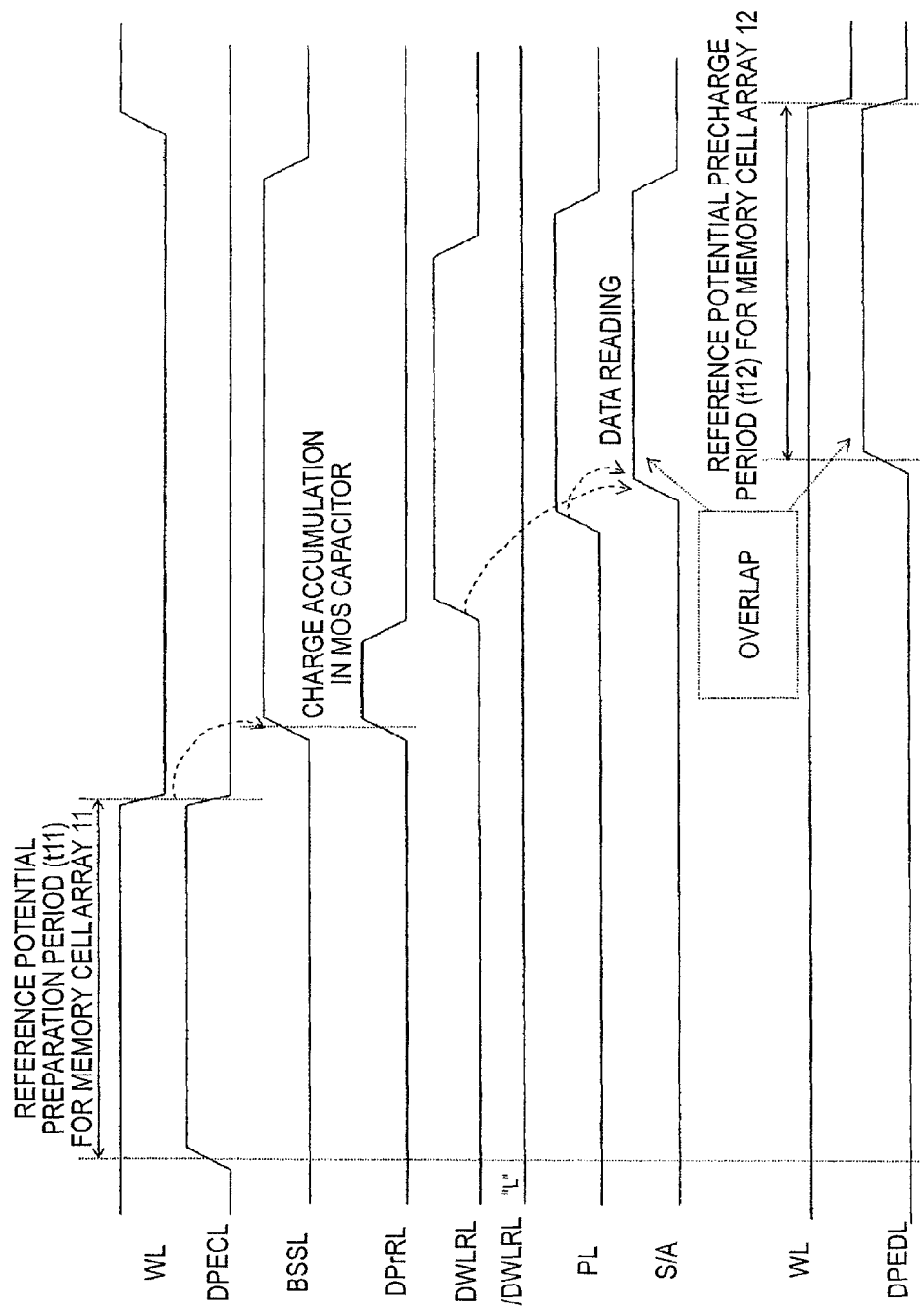
FIG. 9 is an exemplary timing chart showing an operation of a screening test on the semiconductor storage device according to the second embodiment.

Next, a test (screening test) on the semiconductor storage device will be described with reference to FIG. 9. FIG. 9 is a timing chart showing an operation of a screening test on the semiconductor storage device.

As shown in FIG. 9, in the screening test on the semiconductor storage device 71, first, reference potentials are supplied to the memory cell arrays 11 and 12 via reference potential power lines VDXL (symbol VDXL represents the symbols of the plural reference potential power lines). For example, a reference potential precharge period (t11) for the memory cell array 11 is set. More specifically, a word line WL is given the high level and the level of a control line DPECL is changed from the low level to the high level, whereby the potential of the node N2 of the reference potential generation circuit 16 is made approximately equal to the reference potential.

Then, after the end of the reference potential precharge period (t11) for the memory cell array 11, a bit line BL corresponding to a selected memory cell of the memory cell array 11 is rendered in a selected state (high level) and the other bit line BL is rendered in a non-selected state (low level). One of the bit lines BL and /BL (in this example, the bit line BL) is selected and the base dummy control lines DPrRL are given the high level. In the memory cell array 11, the node N2 of the MOS capacitor MCAP0 of the reference potential generation circuit 16 is given the low-potential power supply voltage (ground potential) VSS and the node N1 of the of the MOS capacitor MCAP0 of the reference potential generation circuit 16 is given a base dummy potential. As a result, a potential difference occurs between the nodes N1 and N2 and the MOS capacitor MCAP0 starts to accumulate charge.

Then, the base dummy control lines DPrRL are given the low level and the MOS capacitor MCAP0 completes the charge accumulation.

Then, a base dummy word line DWLRL of the memory cell array 11 is given the high level, the bit line BL is selected, and charge is supplied from the MOS capacitor MCAP0 of the reference potential generation circuit 16 to the selected bit line BL. Furthermore, the control transistor ST14 is turned off and the control transistors ST15 and ST16 are turned on, whereby the MOS capacitor MCAP0 increases the potential of the node N1 through coupling when the potential of the reference potential power line VDXL0 is increased. The selected bit line BL is given the reference potential. At this time, the bit line /BL is not selected because the base dummy word line /DWLRL of the memory cell array 11 is at the low level. A selected plate line PL of the memory cell array 11 is driven (given the high level).

As a result, a read voltage is applied to the selected memory cell of the memory cell array 11 and charge corresponding to a write state ("0" or "1") of the selected memory cell is transferred to the sense amplifier 15 via the selected bit line BL, whereby the information of the selected memory cell is read out. In parallel with this operation, a reference potential precharge period (t12) for the memory cell array 12 is set. More specifically, a word line WL is given the high level and the level of a control line DPEDL is changed from the low level to the high level, whereby the potential of the node N12 of the reference potential generation circuit 19 is made approximately equal to the reference potential.

The reference potential precharge period (t12) for the memory cell array 12 ends in the read cycle of a selected memory cell of the memory cell array 11. After the end of the reference potential precharge period (t12), information of the selected memory cell of the memory cell array 12 is read out in the same manner as in the case of the memory cell array 11.

As described above, the semiconductor storage device 71 according to the embodiment is equipped with the memory cell arrays 11 and 12, the control circuit 13, the terminals Pad1 to Pad7, . . . , the terminal Padk, the terminals Pad11 to Pad17, . . . , and the terminal Padm. The control circuit 13 controls the reference potential generation circuits 16 and 19 which are provided in the respective memory cell arrays 11 and 12. The reference potential preparation period for the memory cell array 11 is controlled by a control signal that is output from the control circuit 13. The reference potential preparation period for the memory cell array 12 is controlled by a control signal that is output from the control circuit 13. After the end of the reference potential preparation period (t11) for the memory cell array 11, reading of information of a selected memory cell of the memory cell array 11 and setting of a reference potential preparation period (t12) for the memory cell array 12 are performed in parallel.

Since the period of reading of information of a selected memory cell of the memory cell array 11 and the reference potential preparation period (t12) for the memory cell array 12 overlap with each other, the reference potential preparation period can be shortened in the MOS capacitor reference potential type semiconductor storage device 71. As a result, the test time (screening test time) of the semiconductor storage device 71 can also be shortened.

Although the embodiment is directed to the parallel TC unit series connection type (chain type) ferroelectric memory in which four memory cells are connected to each other in series, the number of series-connected memory cells may be changed as appropriate. Although in the embodiment the ferroelectric memory cell structure is the parallel TC unit series connection type (chain type), it may be a 1T1C structure, a 2T2C structure, 6T4C structure, or a 1T structure. Furthermore, in the semiconductor storage device 71 which is a parallel TC unit series connection type (chain type) ferroelectric memory, it is preferable that a reference potential to be supplied to a memory cell be corrected properly according to a selected word line.

Embodiment 3

Figure 10:
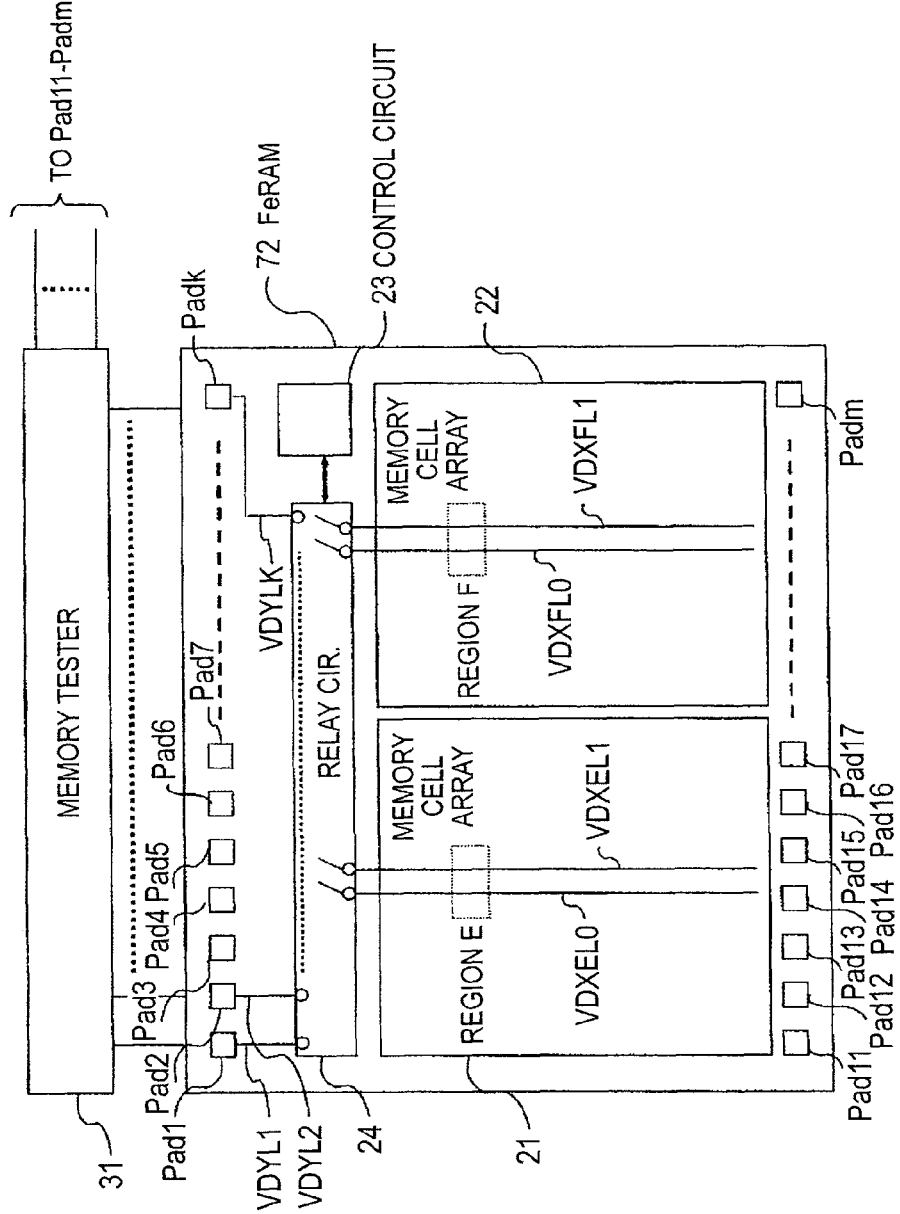
FIG. 10 is an exemplary block diagram of a semiconductor storage device according to a third embodiment of the invention.
Figure 11:
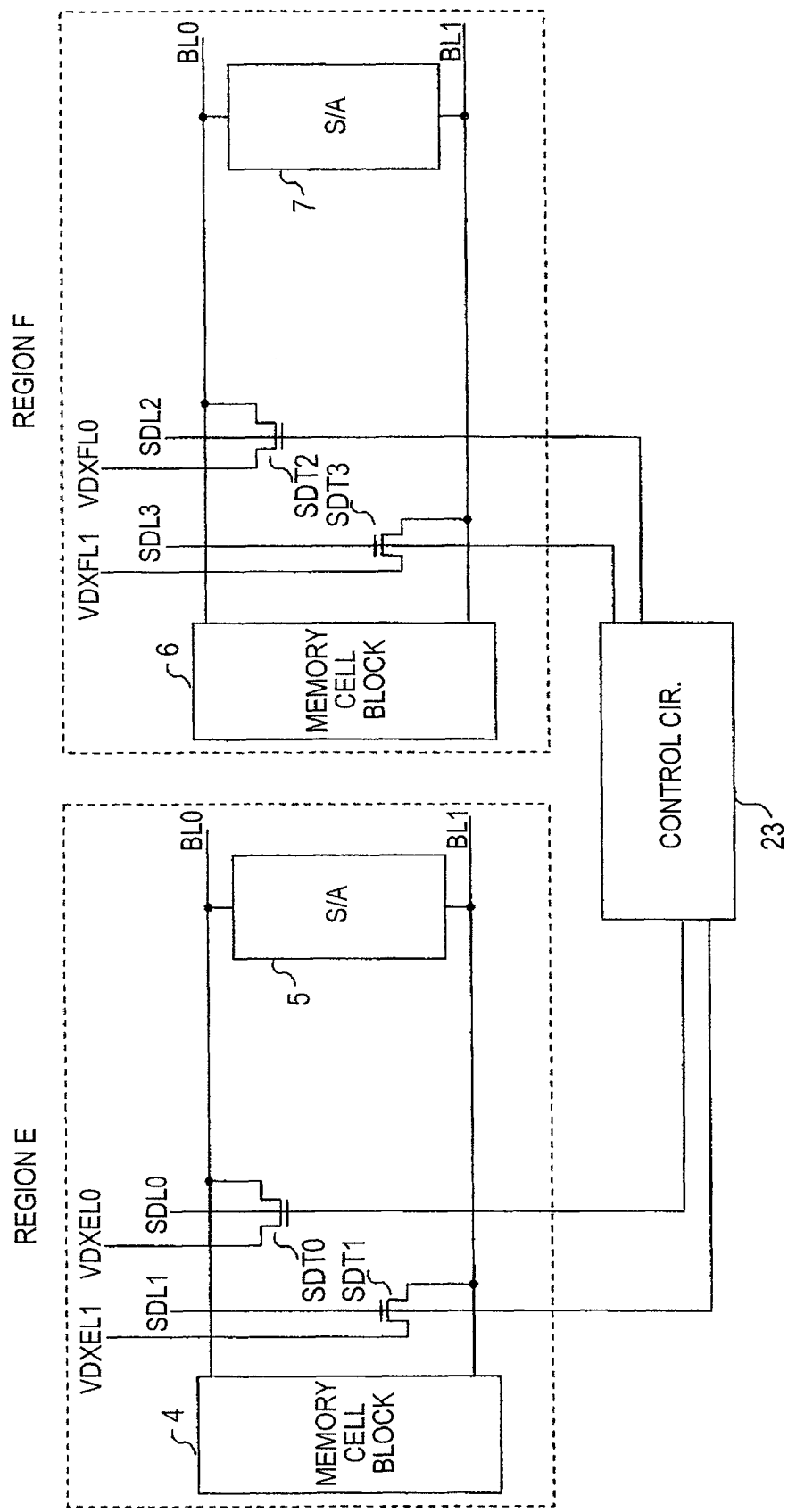
FIG. 11 is an exemplary circuit diagram showing the internal configuration of the semiconductor storage device according to the third embodiment of the invention.

Next, a semiconductor storage device according to a third embodiment of the invention will be described with reference to the drawings. FIG. 10 is a block diagram of a semiconductor storage device. FIG. 11 is a circuit diagram showing the internal configuration of the semiconductor storage device. In this embodiment, a relay circuit and its control circuit which are usually provided in a memory tester which is used for a screening test on a ferroelectric memory are provided in the semiconductor storage device.

In the following, components having the same components in the first embodiment will be given the same reference symbols as the latter.

As shown in FIG. 10, a semiconductor storage device 72 is provided with a memory cell array 21, a memory cell array 22, a control circuit 23, a relay circuit 24, terminals Pad1 to Pad7, ..., a terminal Padk, terminals Pad11 to Pad17, ..., and a terminal Padm. The semiconductor storage device 72 is a 1T1C ferroelectric memory in which each memory cell is composed of one memory cell transistor and one ferroelectric capacitor.

In the semiconductor storage device 72, a test (screening test) is performed by a method in which a reference potential is supplied directly to a selected bit line. During a test, a memory tester 31 is electrically connected to the terminals Pad1 to Pad7, ..., the terminal Padk, the terminals Pad11 to Pad17, ..., and the terminal Padm which are provided in the semiconductor storage device 72. Various control signals, power supply voltages, etc. which are necessary for the test (screening test) are supplied from the memory tester 31 to terminals and such information as a test result is sent from terminals to the memory tester 31. Plural different reference potentials that are necessary for the test (screening test) are supplied from the memory tester 31 to the terminals Pad1 to Pad7, ... and the terminal Padk.

The terminals Pad1 to Pad7, ... and the terminal Padk are disposed in a top end portion of the semiconductor storage device 72 and the terminals Pad11 to Pad17, ... and the terminal Padm are disposed in a bottom end portion of the semiconductor storage device 72. The terminals Pad1 to Pad7, ... and the terminal Padk are connected to the relay circuit 24 via respective reference potential power lines VDYL1-VDYLK.

The memory cell array 21 is disposed in a left portion of the semiconductor storage device 72, and reference potential power line VDXEL0 and VDXEL1 extend in the memory cell array 21. The memory cell array 22 is disposed in a right portion of the semiconductor storage device 72, and reference potential power line VDXFL0 and VDXFL1 extend in the memory cell array 22.

The reference potential power lines VDXEL0 and VDXEL1 penetrate through a region E of the memory cell array 21 and the reference potential power lines VDXFL0 and VDXFL1 penetrate through a region F of the memory cell array 22.

Provided between the terminals Pad11 to Pad17, ... and Padm and the memory cell arrays 21 and 22, the relay circuit 24 selects a necessary reference potential from plural different reference potentials and supplies the selected reference potential to a memory cell.

Disposed in the semiconductor storage device 72, the control circuit 3 is equipped with a control circuit section (not shown) for controlling the relay circuit 24 (i.e., selecting from plural different reference potentials supplied form the memory tester 31) and performing memory control such as memory cell writing, reading, and erasure and a counter section (not shown) for performing counting for, for example, the order of supply of reference potentials to the memory cells. An alternative configuration is possible in which the control circuit 23 is used for the control of the relay circuit 24 and the memory control such as memory cell writing, reading, and erasure is left to another control circuit.

The control circuit 23 may be controlled by external signal inputted from an external apparatus through a given pad (not shown). That is, the relay circuit 24 may be controlled by the external signal.

As shown in FIG. 11, a memory cell block 4, a sense amplifier 5, a reference potential control transistor SDT0, and a reference potential control transistor SDT1 are disposed in the region E of the memory cell array 21.

One of the source and the drain of the reference potential control transistor SDT0 is connected to a bit line BL0, the other of the source and the drain is connected to the reference potential power line VDXEL0 which transmits a reference potential selected by the relay circuit 24, and its gate is connected to a reference potential control line SDL0 which is connected to the control circuit 23. The reference potential control transistor SDT0 is supplied with the reference potential that is transmitted by the reference potential power line VDXEL0. When a control signal transmitted by the reference potential control line SDL0 is at the high level, the reference potential control transistor SDT0 is on and supplies the reference potential to a memory cell that is connected to the bit line BL0.

One of the source and the drain of the reference potential control transistor SDT1 is connected to a bit line BL1, the other of the source and the drain is connected to the reference potential power line VDXEL1 which transmits a reference potential selected by the relay circuit 24, and its gate is connected to a reference potential control line SDL1 which is connected to the control circuit 23. The reference potential control transistor SDT1 is supplied with the reference potential that is transmitted by the reference potential power line VDXEL1. When a control signal transmitted by the reference potential control line SDL1 is at the high level, the reference potential control transistor SDT1 is on and supplies the reference potential to a memory cell that is connected to the bit line BL1.

As shown in FIG. 11, a memory cell block 6, a sense amplifier 7, a reference potential control transistor SDT2, and a reference potential control transistor SDT3 are disposed in the region F of the memory cell array 22.

One of the source and the drain of the reference potential control transistor SDT2 is connected to the bit line BL0, the other of the source and the drain is connected to the reference potential power line VDXFL0 which transmits a reference potential selected by the relay circuit 24, and its gate is connected to a reference potential control line SDL2 which is connected to the control circuit 23. The reference potential control transistor SDT2 is supplied with the reference potential that is transmitted by the reference potential power line VDXFL0. When a control signal transmitted by the reference potential control line SDL2 is at the high level, the reference potential control transistor SDT2 is on and supplies the reference potential to a memory cell that is connected to the bit line BL0.

One of the source and the drain of the reference potential control transistor SDT3 is connected to a bit line BL1, the other of the source and the drain is connected to the reference potential power line VDXFL1 which transmits a reference potential selected by the relay circuit 24, and its gate is connected to a reference potential control line SDL3 which is connected to the control circuit 23. The reference potential control transistor SDT3 is supplied with the reference potential that is transmitted by the reference potential power line VDXFL1. When a control signal transmitted by the reference potential control line SDL3 is at the high level, the reference potential control transistor SDT3 is on and supplies the reference potential to a memory cell that is connected to the bit line BL1.

Next, a test (screening test) on the semiconductor storage device will be described with reference to FIG. 12. FIG. 12 is a timing chart showing an operation of a screening test on the semiconductor storage device. In this embodiment, a necessary reference potential is selected from plural different reference potentials by the relay circuit 24 and the selected reference potential is supplied to a memory cell.

As shown in FIG. 12, in the screening test on the semiconductor storage device 72, first, reference potentials are supplied to the memory cell arrays 21 and 22 via reference potential power lines VDYL corresponding to terminals that are selected by the relay circuit 24. For example, as a first access, a reference potential precharge period (t21) for a first memory cell in the memory cell array 21 is set.

More specifically, a selected word line WL is given the low level and the level of a selected reference potential power line VDXEL is changed from the low level to the high level, whereby a selected reference potential control transistor SDT is turned on and a selected bit line BL is precharged to the reference potential.

Then, the level of the reference potential power line VDXEL is changed from the high level to the low level, the level of the word line WL is changed from the low level to the high level, and the level of a plate line PL is changed from the low level to the high level, whereby it becomes possible to read out information of the first memory cell.

Then, as a second access, a reference potential precharge period (t22) for a second memory cell in the memory cell array 22 is set. More specifically, a selected word line WL is given the low level and the level of a selected reference potential power line VDXEL is changed from the low level to the high level, whereby a selected reference potential control transistor SDT is turned on and a selected bit line BL is precharged to the reference potential. In parallel with this operation, the level of the sense amplifier 5 is changed from the low level to the high level, whereby charge corresponding to a write state ("0" or "1") of the selected first memory cell in the memory cell array 11 is transferred to the sense amplifier 5 via the selected bit line BL and information of this memory cell is read out.

That is, the reference potential precharge period (t22) for the second memory cell in the memory cell array 22 and the reading period for the information of the first memory cell overlap with each other.

As described above, the semiconductor storage device 72 according to the embodiment is equipped with the memory cell arrays 21 and 22, the control circuit 23, the relay circuit 24, the terminals Pad1 to Pad7, . . . , the terminal Padk, the terminals Pad11 to Pad17, . . . , and the terminal Padm. The relay circuit 24 selects one of plural different reference potentials supplied form the memory tester 31 according to an instruction from the control circuit 23, and supplies it to the memory cell arrays 21 and 22. Reference potential precharging for the memory cell array 21 is performed in such a manner that a reference potential control transistor SDT which is supplied with a reference potential via the relay circuit 24 and whose gate is connected to a reference potential control line SDL that is connected to the control circuit 23 is turned on and a bit line BL is thereby selected. Reference potential precharging for the memory cell array 22 is performed in such a manner that a reference potential control transistor SDT which is supplied with a reference potential via the relay circuit 24 and whose gate is connected to a reference potential control line SDL that is connected to the control circuit 23 is turned on and a bit line BL is thereby selected. After the reference potential precharging of the memory cell of the memory cell array 21, reference potential precharging of the memory cell of the memory cell array 22 is performed parallel with reading of information of the memory cell of the memory cell array 21.

Since the reading of information of a memory cell of the memory cell array 21 and the reference potential precharging of a memory cell of the memory cell array 22 are performed with an overlap in time, the precharge period can be shortened. Furthermore, since the relay circuit 24 is provided, the reference potential of another memory cell array can be switched in a read cycle of one memory cell array.

Therefore, the time of a test (screening test) using plural reference potentials can be shortened.

The invention is not limited to the above embodiments and various modifications are possible without departing from the spirit and scope of the invention.

For example, in the third embodiment, the switching between reference potentials of the reference potential direct application method is performed by the relay circuit. Likewise, in the second embodiment, the switching between reference potentials of the MOS capacitor reference potential method may be performed by using a relay circuit.

As described with reference to the above embodiments, there is provided a semiconductor storage device capable of shortening the time that is taken by a test which uses plural reference potentials.

The above embodiments provide a semiconductor storage device capable of shortening the time that is taken by a test which uses reference potentials.

What is claimed is:
1. A semiconductor storage device comprising:
a first memory cell array comprising:
  a first bit line;
  a first plate line;
  a first memory cell between the first bit line and the first plate line;
  a first sense amplifier connected to the first bit line;
  a first reference power line configured to supply a first reference voltage to the first bit line;
  a first switching module configured to control a connection between the first reference power line and the first bit line based on a control signal;
a second memory cell array comprising:
  a second bit line;
  a second plate line;
  a second memory cell between the second bit line and the second plate line;
  a second sense amplifier connected to the second bit line;
  a second reference power line configured to supply a second reference voltage to the second bit line, the second reference power line being electrically separated from the first reference power line;
  a second switching module configured to control a connection between the second reference power line and the second bit line based on the control signal;

a control module configured to generate the control signal in order to control a time difference between the first memory cell array and the second memory cell array in precharge operation of the first bit line and the second bit line.

2. The device of claim 1 further comprising a relay module including:
   a plurality of input terminals to which a plurality of voltages different with each other are input;
   a first output module configured to selectively output one of the plurality of voltages to the first reference power line as the first reference voltage; and
   a second output module configured to selectively output one of the plurality of voltages to the second reference power line as the second reference voltage.

3. The device of claim 1, wherein each of the first memory cell and the second memory cell is one of a 1T1C type memory cell, a 2T2C type memory cell, and a 6T4C type memory cell.

4. The device of claim 1, wherein each of the first memory cell and the second memory cell is TC unit series connection type memory cell.

5. The device of claim 1,
   wherein the first memory cell comprises a first capacitor and a first memory cell transistor, and the second memory cell comprises a second capacitor and a second memory cell transistor;
   wherein the first capacitor is connected to the first plate line,
   wherein the first memory cell transistor is connected to the first bit line,
   the first memory cell transistor is serially connected to the first capacitor,
   the second capacitor is connected to the second plate line,
   the second memory cell transistor is connected to the second bit line, and
   the second memory cell transistor is serially connected to the second capacitor.

6. The device of claim 1, wherein each of the first switching module and the second switching module comprises a Metal-Oxide-Semiconductor Field-Effect Transistor (MOSFET).

7. The device of claim 1, wherein the control module is configured to generate the control signal based on an external signal input from an external apparatus.

8. The device of claim 2 further comprising a relay control module configured to control the first output module and the second output module based on an external signal input from an external apparatus.

9. The device of claim 1, wherein the control module is configured to control the first switching module and the second switching module in order to precharge the second bit line to read out second data stored in the second memory cell while data stored in the first memory cell is being read out.

* * * * *